United States Patent
Ryan et al.

(10) Patent No.: US 9,520,321 B2
(45) Date of Patent: Dec. 13, 2016

(54) INTEGRATED CIRCUITS AND METHODS FOR FABRICATING INTEGRATED CIRCUITS WITH SELF-ALIGNED VIAS

(71) Applicant: GLOBALFOUNDRIES, Inc., Grand Cayman, KY (US)

(72) Inventors: Errol Todd Ryan, Clifton Park, NY (US); Sean X. Lin, Watervliet, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 21 days.

(21) Appl. No.: 14/633,914

(22) Filed: Feb. 27, 2015

(65) Prior Publication Data

US 2016/0254185 A1    Sep. 1, 2016

(51) Int. Cl.
    *H01L 21/44*      (2006.01)
    *H01L 29/40*      (2006.01)
    *H01L 21/768*     (2006.01)
    *H01L 23/522*     (2006.01)

(52) U.S. Cl.
    CPC ... *H01L 21/76805* (2013.01); *H01L 21/76877* (2013.01); *H01L 23/5226* (2013.01)

(58) Field of Classification Search
    CPC .................. H01L 21/76805; H01L 23/5226
    USPC .................. 438/672–675; 257/773–776, 622
    See application file for complete search history.

(56) References Cited

U.S. PATENT DOCUMENTS

| | | | | |
|---|---|---|---|---|
| 6,756,299 | B2* | 6/2004 | Nagashima | H01L 21/76811 438/637 |
| 7,199,038 | B2* | 4/2007 | Miyajima | H01L 21/76801 438/618 |
| 7,994,046 | B2* | 8/2011 | Jeng | H01L 21/76814 438/619 |
| 8,664,113 | B2* | 3/2014 | Kim | H01L 23/5226 438/637 |
| 8,927,423 | B2* | 1/2015 | Fu | H01L 29/401 29/401 |

\* cited by examiner

*Primary Examiner* — Calvin Lee
(74) *Attorney, Agent, or Firm* — Lorenz & Kopf, LLP (57) ABSTRACT

Integrated circuits and methods for fabricating integrated circuits with self-aligned vias are disclosed. A method for fabricating an integrated circuit includes forming a first conductive interconnect line overlying a semiconductor substrate. The method forms an insulator cap defining a gap overlying the first conductive interconnect line. An upper interlayer dielectric material is deposited over the insulator cap and in the gap over the first conductive interconnect line. A via is etched through the upper interlayer dielectric material and into the gap to expose the first conductive interconnect line. The method deposits a conductive material into the via to form a conductive via in contact with the first conductive interconnect line.

16 Claims, 7 Drawing Sheets

INTEGRATED CIRCUITS AND METHODS FOR FABRICATING INTEGRATED CIRCUITS WITH SELF-ALIGNED VIAS

TECHNICAL FIELD

The present disclosure generally relates to integrated circuits and methods for fabricating integrated circuits. More particularly, the present disclosure relates to integrated circuits with self-aligned vias and related fabrication methods.

BACKGROUND

In the fabrication of modern microstructures, such as integrated circuits, there is a continuous drive to steadily reduce the feature sizes of microstructure elements, thereby enhancing the functionality of these structures. For instance, in modern integrated circuits, minimum feature sizes, such as the channel length of field effect transistors, have reached the deep sub-micron range, thereby increasing performance of these circuits in terms of speed and/or power consumption and/or diversity of functions. As the size of individual circuit elements is reduced with every new circuit generation, thereby improving, for example, the switching speed of the transistor elements, the available floor space for interconnect lines electrically connecting the individual circuit elements is also decreased. Consequently, the dimensions of these interconnect lines are also reduced to compensate for a reduced amount of available floor space and for an increased number of circuit elements provided per unit die area, as typically the number of interconnections required increases in an over-proportional manner relative to the number of circuit elements. Thus, a plurality of stacked wiring layers, also referred to as metallization layers, are usually provided, wherein individual metal lines of one metallization layer are connected to individual metal lines of an overlying or underlying metallization layer by so-called conductive vias. Despite the provision of a plurality of metallization layers, reduced dimensions of the interconnect lines are necessary to comply with the enormous complexity of, for instance, modern CPUs, memory chips, ASICs (application specific integrated circuits) and the like.

With reduced space between individual metal lines within a metallization layer, it becomes difficult to form a conductive via in electrical connection with one metal line while maintaining sufficient insulation between the conductive via and the adjacent metal line. For example, an overlay error during via formation may result in too little insulation between the conductive via and the adjacent metal line. As a result, time dependent dielectric breakdown (TDDB) may occur in the dielectric material located between the conductive via and the adjacent metal line.

Accordingly, it is desirable to provide integrated circuits and methods for fabricating integrated circuits that provide improved self-aligned vias. Additionally, it is desirable to provide integrated circuits and methods for fabricating integrated circuits in which vias are self-aligned with a lower metal line in a first orientation or direction and are self-aligned with an upper metal line in second orientation or direction that is transverse or perpendicular to the first orientation. Also, it is desirable to provide methods for the fabrication of such structures that are easily integrated into existing process flow schemes used in semiconductor fabrication facilities. Furthermore, other desirable features and characteristics of the present disclosure will become apparent from the subsequent detailed description and the appended claims, taken in conjunction with the accompanying drawings and the foregoing technical field and background.

BRIEF SUMMARY

Integrated circuits and methods for fabricating integrated circuits are disclosed. In one exemplary embodiment, a method for fabricating an integrated circuit includes forming a first conductive interconnect line overlying a semiconductor substrate. The method forms an insulator cap defining a gap overlying the first conductive interconnect line. An upper interlayer dielectric material is deposited over the insulator cap and in the gap over the first conductive interconnect line. A via is etched through the upper interlayer dielectric material and into the gap to expose the first conductive interconnect line. The method deposits a conductive material into the via to form a conductive via in contact with the first conductive interconnect line.

In another exemplary embodiment, a method for fabricating an integrated circuit includes depositing a first interlayer dielectric material over a semiconductor substrate. A first conductive interconnect line is formed in the first interlayer dielectric material. The first conductive interconnect line has an upper surface at a first height over the semiconductor substrate. An insulator cap is formed over the first interlayer dielectric material and has a top surface at a second height over the semiconductor substrate that is greater than the first height. The method deposits a second interlayer dielectric material over the first conductive interconnect line and the insulator cap and etches a via into the second interlayer dielectric to expose the upper surface of the first conductive interconnect line. The method includes depositing a conductive material into the via to form a conductive via in contact with the first conductive interconnect line.

Another exemplary embodiment provides an integrated circuit. The integrated circuit includes a lower interlayer dielectric material overlying a semiconductor substrate and a first conductive interconnect line overlying the lower interlayer dielectric material. Also, the integrated circuit includes an insulator cap overlying the lower interlayer dielectric material and defining a gap overlying the first conductive interconnect line. An upper interlayer dielectric material lies over the insulator cap. The integrated circuit includes a conductive via having a first end in the gap and in electrical contact with the first conductive interconnect line and a second end. Further, the integrated circuit includes a second conductive interconnect line overlying the upper interlayer dielectric material and in electrical contact with the second end of the conductive via.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The present disclosure will hereinafter be described in conjunction with the following drawing figures, wherein like numerals denote like elements, and wherein.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Embodiments of the present disclosure are generally directed to interconnect structures formed during back-end-of-line (BEOL) processing of integrated circuits. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

As used herein, it will be understood that when an element or layer is referred to as being "on" another element or layer, it is directly on the other element or layer, whereas an element or layer referred to as being "over" or "overlying" another element or layer may be directly on the other element or directly on an intervening element(s) or layer(s). Further, spatially relative terms, such as "lower," "upper", "over", "overlying", "top", "bottom" and the like, may be used herein for ease of description to describe one element's or feature's relationship to another element or feature as illustrated in the figures but are not limited to the orientation of the figures.

Figure 1:
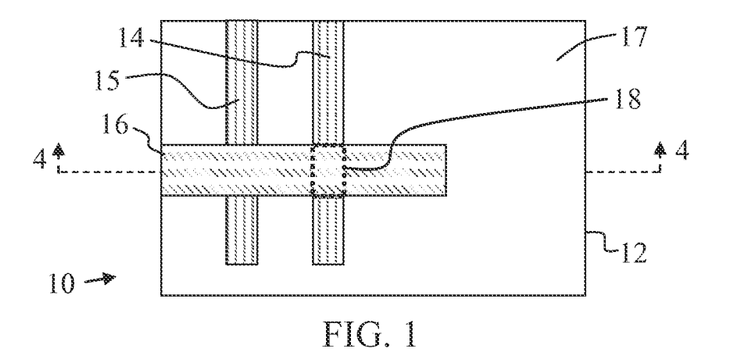
FIGS. 1-3 are overhead schematic views of an integrated circuit and fabrication methods for forming a first conductive interconnect line, a second conductive interconnect line, and a conductive via electrically connecting the interconnect lines in accordance with an exemplary embodiment.
Figure 2:
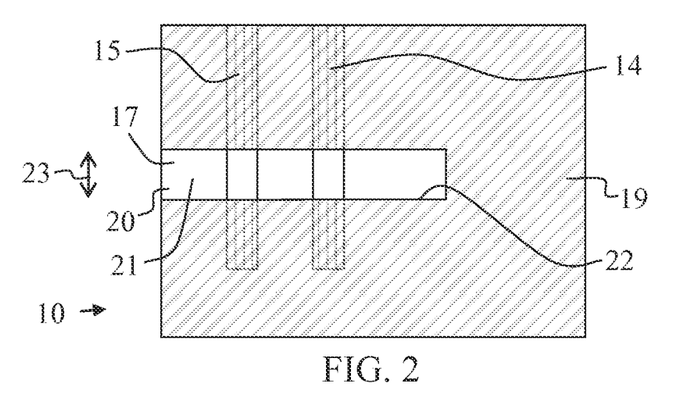
Figure 3:
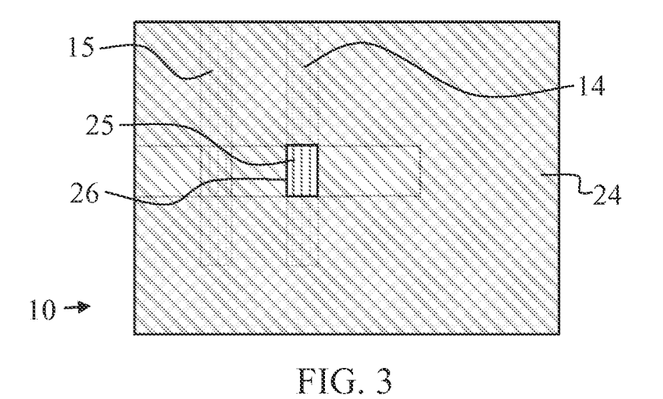
Figure 9:
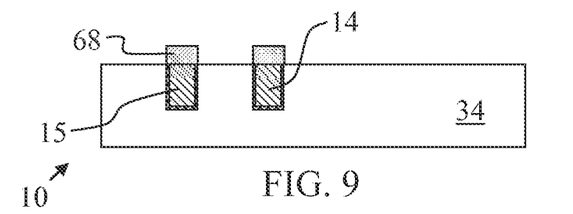
Figure 10:
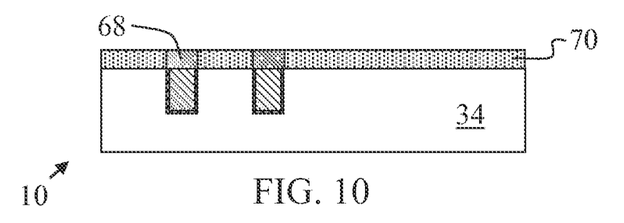
Figure 11:
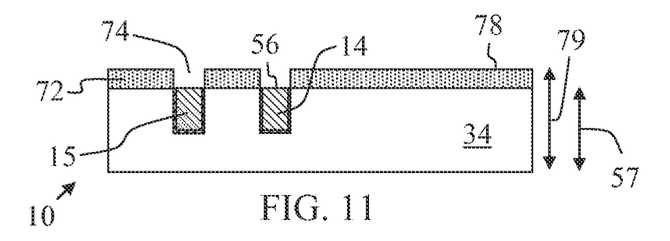

FIGS. 1-3 illustrate an overhead schematic view of an integrated circuit 10 and methods for fabricating an integrated circuit in accordance with various embodiments of the present disclosure. FIGS. 4-24 are cross-sectional views taken along line 4-4 in FIG. 1 of the integrated circuit 10 during various stages of processing. FIGS. 4-8 illustrate an embodiment for forming an insulator cap with a gap exposing a lower conductive interconnect line. FIGS. 9-11 illustrate another embodiment for forming an insulator cap with a gap exposing a lower conductive interconnect line. FIGS. 12-19 illustrate another embodiment for forming an insulator cap with a gap exposing a lower conductive interconnect line. FIGS. 20-24 illustrate the formation of an upper conductive interconnect line and a conductive via electrically connecting the upper conductive interconnect line and a selected lower conductive interconnect line.

As shown in FIG. 1, the integrated circuit 10 includes a semiconductor substrate 12. The semiconductor substrate 12 may be a semiconductor on insulator (SOI) wafer or a bulk semiconductor wafer. The semiconductor substrate 12 can utilize any appropriate semiconductor material, such as silicon, germanium, gallium arsenide, and the like. While the semiconductor substrate 12 may include any suitable semiconductor material, an exemplary embodiment employs silicon material, such as the relatively pure silicon materials typically used in the semiconductor industry as well as silicon admixed with other elements.

The integrated circuit 10 further includes lower conductive interconnect lines 14 and 15 overlying the semiconductor substrate 12. Also, the integrated circuit 10 includes an upper conductive interconnect line 16 overlying the lower conductive interconnect lines 14 and 15. An upper interlayer dielectric material 17 is formed over the lower conductive interconnect lines 14 and 15, and the upper conductive interconnect line 16 is formed over the upper interlayer dielectric material 17 (upper interlayer dielectric material 17 is transparent in FIGS. 1-3 to provide a view of the underlying lower conductive interconnect lines 14 and 15.

A conductive via 18 is formed through the upper interlayer dielectric material 17 and between the lower conductive interconnect line 14 and the upper conductive interconnect line 16. While conductive via 18 is illustrated in FIG. 1 for clarity, conductive via 18 is formed below the upper conductive interconnect line 16 and would be hidden in the overhead view.

FIGS. 2 and 3 illustrate how the top end of the conductive via 18 may be self-aligned with the upper conductive interconnect line 16 shown in FIG. 1. In FIG. 2, the lower conductive interconnect lines 14 and 15 have been formed. The upper interlayer dielectric material 17 is deposited over the lower conductive interconnect lines 14 and 15. Then, a mask 19 is patterned over the upper interlayer dielectric material 17 and the lower conductive interconnect line 14. An exemplary mask 19 is a titanium nitride hard mask. The mask 19 may be patterned using conventional processing such as deposition of an oxide hard mask, a titanium nitride layer, an organic planarizing layer (OPL), an anti-reflective coating (ARC) and photoresist, followed by patterning. The mask 19 is formed with an opening 20 overlying the portion of the lower conductive interconnect line 14 to which the conductive via 18 will be formed. The opening 20 exposes a region 21 of the upper interlayer dielectric material 17.

In the orientation of FIG. 2, opening 20 is defined by edges 22 extending in a lateral direction and defining an opening thickness indicated by double headed arrow 23. The top end of the later-formed conductive via 18 will be self-aligned with the edges 22.

After patterning the mask 19, a second mask 24 is formed overlying mask 19 and the region 21 of the upper interlayer dielectric material 17 exposed by opening 20. An exemplary mask 24 may be formed by depositing an OPL, an ARC, and a photoresist layer, and patterning the layers to form the second mask 24 with opening 25. In the orientation of FIG. 3, the opening 25 has edges 26 extending in a vertical direction. The top end of the later-formed conductive via 18 will be self-aligned with the edges 26. In FIG. 3, the edges 26 extend for a length substantially equal to the thickness 23; however, each edge 26 may have a length greater than thickness 23.

After processing to establish the structure of FIG. 3, an etch may be performed to remove the upper interlayer dielectric material 17 underlying both opening 20 and opening 25. As a result, an etched via is formed through the upper interlayer dielectric material 17 and exposes a portion of the lower conductive interconnect line 14.

It may be seen from FIGS. 1-3 that an overlay issue when forming the opening 25 in mask 24 (and the resulting conductive via 18), e.g., a shift leftward of opening 25 (and conductive via 18) in the drawings, may result in formation of the conductive via 18 too near to the lower conductive interconnect line 15, leaving too little insulation between the lower conductive interconnect line 15 and the conductive via 18. As a result, time dependent dielectric breakdown (TDDB) may occur in the upper interlayer dielectric material 17 located between the conductive via 18 and the lower conductive interconnect line 15. FIGS. 4-24 illustrate embodiments in which the bottom end of the conductive via 18 is self-aligned to the lower conductive interconnect line 14 to avoid violating a minimum insulator requirement between the conductive via 18 and the lower conductive interconnect line 15.

Figure 4:
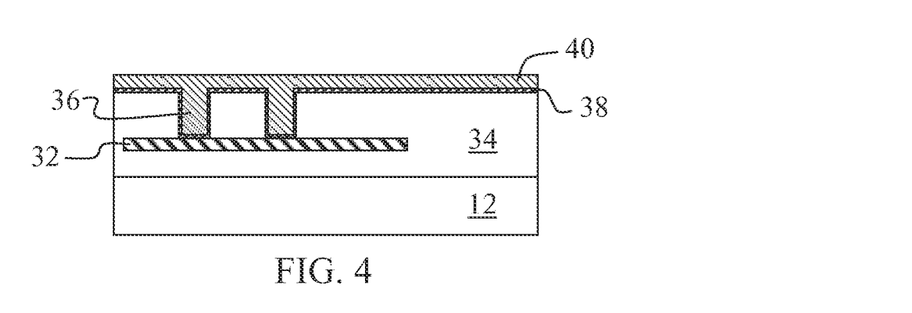
FIGS. 4-24 illustrate, in cross section, an integrated circuit and methods for fabricating an integrated circuit with a first conductive interconnect line, a second conductive interconnect line, and a conductive via electrically connecting the interconnect lines in accordance with various embodiments of the present disclosure.

FIG. 4 illustrates that a device contact line 32, such as a copper interconnect, is formed over the semiconductor substrate 12 in accordance with conventional front-end-of-line (FEOL) processing. For example, the device contact line 32 may be formed in contact with semiconductor devices such as logic or memory devices, contacts, or other elements typical of an integrated circuit 10. After formation of the device contact line 32, a lower interlayer dielectric material 34 is deposited over the semiconductor substrate 12. An exemplary lower interlayer dielectric material 34 is an ultra low-k (ULK) material. An ULK material has a dielectric constant, k, of less than about 2.55. An exemplary lower interlayer dielectric material 34 is silicon oxycarbide (SiCOH) or organosilicate glass, and may include two or more layers or such materials. In an exemplary embodiment, the lower interlayer dielectric material 34 is deposited by plasma enhanced chemical vapor deposition (PECVD).

The lower interlayer dielectric material 34 may be etched to form trenches 36 in accordance with conventional processing. For example, a mask (not shown) may be deposited and patterned to expose portions of the lower interlayer dielectric material 34. An etch process may then be performed to etch the exposed portions of the lower interlayer dielectric material 34 to form trenches 36 and the mask may be removed. Then, a barrier or liner material 38 may be deposited over the lower interlayer dielectric material 34 including in the trenches 36. In an exemplary embodiment, the liner material 38 is deposited by physical vapor deposition (PVD) or atomic layer deposition (ALD) or another suitable process. The liner material 38 may be formed with a thickness of from about 0.5 nm to about 3 nm. An exemplary liner material 38 is a tantalum nitride/ruthenium bilayer, though any suitable barrier material may be used.

As shown in FIG. 4, a conductive material 40 is deposited over the liner material 38 and fills the trenches 36. An exemplary conductive material is copper, through any suitable material, such as other metals may be used. In an exemplary embodiment, the conductive material is deposited by electroless deposition or by electroplating. Such a process may include depositing a seed layer (not separately illustrated) before forming the conductive material 40 over the seed layer.

Figure 5:
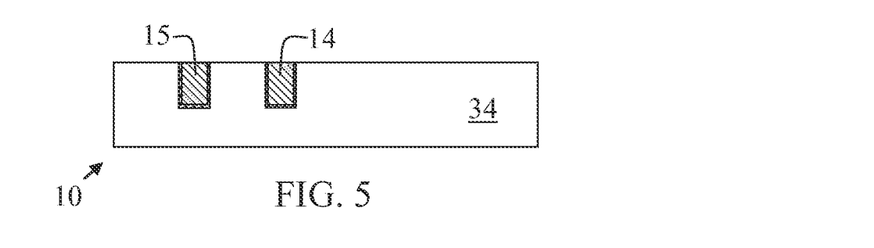

The exemplary method continues in FIG. 5 with removal of the overburden portion of the liner material 38 and the conductive material 40 lying outside trenches 36. For example, the overburden portion of the liner 38 and conductive material 40 may be planarized by chemical-mechanical planarization (CMP). As a result, the lower conductive interconnect lines 14 and 15 are formed embedded in and overlying the lower interlayer dielectric material 34. Though not illustrated, the lower conductive interconnect lines 14 and 15 may be selectively formed in electrical connection with desired device contact lines 32. It is noted that FIGS. 5-24 do not show the semiconductor substrate 12 underlying the lower interlayer dielectric material 34 or the device contact line 32 for purposes of economy and clarity. Such elements may be assumed to be present in the structure of the partially fabricated integrated circuit 10 of FIGS. 5-24.

Figure 6:
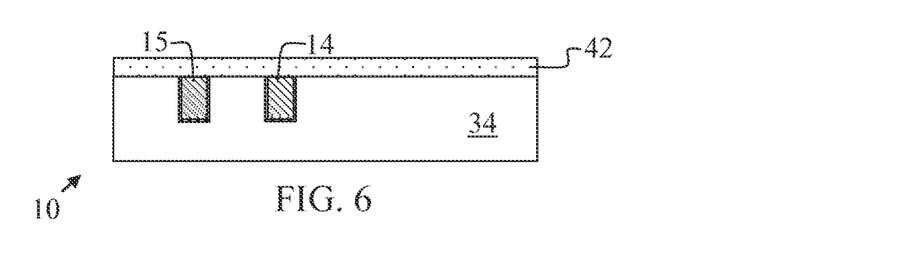

In FIG. 6, a capping material 42 is deposited over the lower conductive interconnect lines 14 and 15 and the lower interlayer dielectric material 34. An exemplary capping material 42 is a metal that may be oxidized. For example, the capping material 42 may be hafnium, manganese, cobalt, cobalt phosphorus (CoP), or cobalt tungsten phosphorus (CoWP). The capping material 42 may be formed with a thickness of from about 3 nm to about 10 nm. In an exemplary embodiment, the capping material is deposited by PVD, CVD, or ALD.

Figure 7:
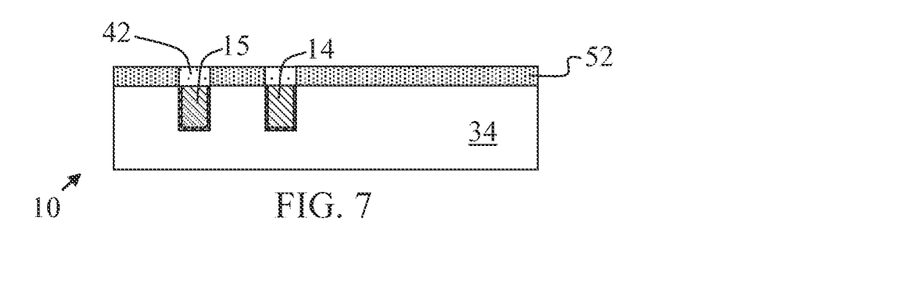

In FIG. 7, an annealing process is performed to cause a reaction between the capping material and the underlying dielectric, which contains oxygen, such that the capping material 42 is oxidized where the capping material 42 is in contact with the lower interlayer dielectric material 34. The oxidized capping material forms an insulator cap 52. Thus, the insulator cap 52 is selectively formed on the lower interlayer dielectric material 34. As shown, non-oxidized portions of the capping material 42 remain overlying, and aligned with, the lower conductive interconnect lines 14 and 15.

Figure 8:
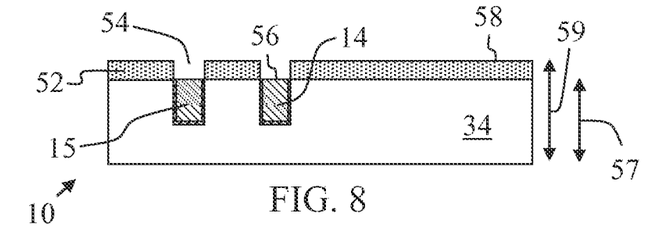

The non-oxidized capping material is removed from the integrated circuit 10 in FIG. 8. In an exemplary embodiment, the non-oxidized capping material is removed by a wet clean process. An exemplary wet clean chemistry is selected so that the liner material and conductive material of the lower conductive interconnect lines 14 and 15 are not removed. For example, the wet clean may be performed using various wet chemical mixtures that are compatible with copper including dilute acids, such as dilute sulfuric acid, base solutions with pH between 7 and 12, aqueous solution with pH between 4 and 9, or other suitable chemistries. As a result, the integrated circuit 10 is formed with the insulator cap 52 over the lower interlayer dielectric material 34. The insulator cap 52 defines gaps 54 overlying and exposing the lower conductive interconnect lines 14 and 15. In an exemplary embodiment, the insulator cap 52 is formed with a thickness of from about 3 nm to about 10 nm. The lower conductive interconnect lines 14 and 15 have upper surfaces 56 at a height 57 from the semiconductor substrate 12. Further, the insulator cap 52 has an upper surface 58 at a height 59 from the semiconductor substrate 12. As shown, height 59 is greater than height 57. The structure of the integrated circuit 10 in FIG. 8 may be further processed according to FIGS. 20-24 below.

FIGS. 9-11 illustrate an alternative embodiment for selectively forming an insulator cap on the lower interlayer dielectric material with gaps exposing the lower conductive interconnect lines. FIG. 9 processes the integrated circuit 10 of FIG. 5. As shown, a temporary cap 68 is selectively formed on the lower conductive interconnect lines 14 and 15. An exemplary temporary cap 68 is metal, such as for example cobalt, cobalt phosphorus (CoP), cobalt tungsten phosphorus (CoWP), nickel phosphorus (NiP), or similar metals conventionally used in semiconductor fabrication processes. In exemplary embodiments, the temporary cap 68 is formed by electroless deposition or electroplating processes that selectively form the temporary cap material on the lower conductive interconnect lines 14 and 15. The temporary cap 68 may be formed with a thickness of from about 3 nm to about 10 nm.

In FIG. 10, a capping material 70 is deposited over the temporary caps 68 and the lower interlayer dielectric material 34. In exemplary embodiments, the capping material 70 is deposited by PECVD, CVD, ALD, or spin-on processes. Further, the capping material 70 may be any dielectric or metal oxide material that may be deposited, such as by PECVD, CVD, ALD, or spin-on processes. For example, the capping material 70 may include silicon carbide nitride (SiCN), silicon carbide (SiC) and/or silicon nitride (SiN) films. As shown in FIG. 10, the capping material 70 overlying the temporary caps 68 is removed. For example, a CMP process may be used to remove the capping material 70 overlying the temporary caps 68.

FIG. 11 illustrates the removal of the temporary caps 68 and formation of the insulator cap 72 having gaps 74 exposing the upper surfaces 56 of the lower conductive interconnect lines 14 and 15. In an exemplary embodiment, the temporary caps 68 are removed by various wet chemical mixtures that are compatible with copper including dilute acids, such as dilute sulfuric acid, base solutions with pH between 7 and 12, aqueous solution with pH between 4 and 9, or other suitable chemistries. The insulator cap 72 covers the lower interlayer dielectric material 34. In an exemplary embodiment, the insulator cap 72 is formed with a thickness of from about 3 nm to about 10 nm. The upper surfaces 56 of the lower conductive interconnect lines 14 and 15 are at a height 57 from the semiconductor substrate 12. Further, the insulator cap 72 has an upper surface 78 at a height 79 from the semiconductor substrate 12. As shown, height 79 is greater than height 57. The structure of the integrated circuit 10 in FIG. 11 may be further processed according to FIGS. 20-24 below.

Figure 12:
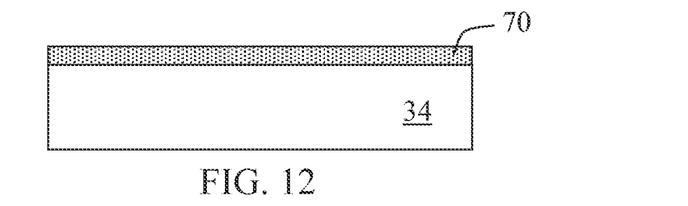

FIGS. 12-19 illustrate an alternative embodiment for selectively forming an insulator cap on the lower interlayer dielectric material with gaps exposing the lower conductive interconnect lines. FIG. 12 illustrates the deposition of a capping material 70 over lower interlayer dielectric material 34 before the formation of trenches therein. In exemplary embodiments, the capping material 70 is deposited by PECVD, CVD, ALD, or spin-on processes. Further, the capping material 70 may be any dielectric or metal oxide material that may be deposited, such as by PECVD, CVD, ALD, or spin-on processes. For example, the capping material 70 may include silicon carbide nitride (SiCN), silicon carbide (SiC) and/or silicon nitride (SiN) films. An exemplary capping material 70 has a thickness of from about 3 nm to about 10 nm.

Figure 13:
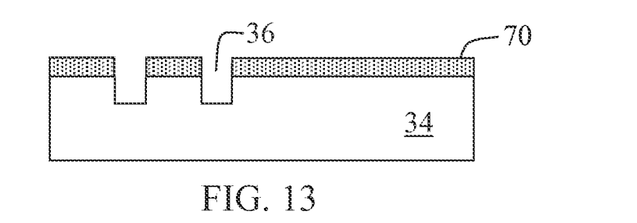

In FIG. 13, trenches 36 are etched through the capping material 70 and into the lower interlayer dielectric material 34 in accordance with conventional processing. For example, a mask (not shown) may be deposited and patterned to expose portions of the capping material 70. An etch process may then be performed to etch the exposed portions of the capping material 70 and the underlying lower interlayer dielectric material 34 to form trenches 36, and the mask may be removed.

Figure 14:
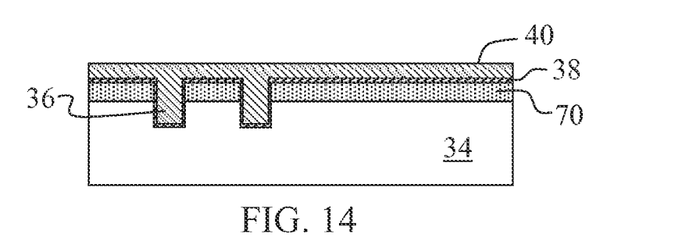

In FIG. 14, the barrier or liner material 38 may be deposited over the capping material 70 and over the lower interlayer dielectric material 34 in the trenches 36. In an exemplary embodiment, the liner material 38 is conformally deposited by PVD, ALD, or another suitable process. The liner material 38 may be formed with a thickness of from about 0.5 nm to about 3 nm. An exemplary liner material 38 is a tantalum nitride/ruthenium bilayer, though any suitable barrier material may be used.

As further shown, conductive material 40 is deposited over the liner material 38 and fills the trenches 36. An exemplary conductive material is copper, though any suitable conductive material, such as other metals may be used. In an exemplary embodiment, the conductive material is deposited by electroless deposition or by electroplating. Such a process may include depositing a seed layer before forming the conductive material 40 over the seed layer.

Figure 15:
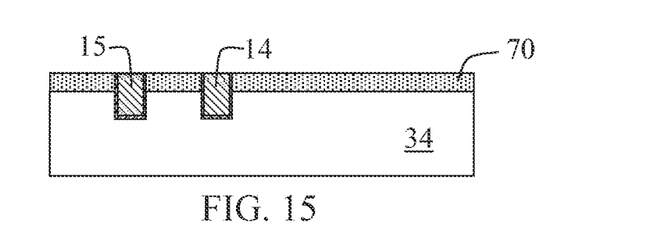

The exemplary method continues in FIG. 15 with removal of the overburden portion of the liner 38 and the conductive material 40 lying outside trenches 36. For example, the overburden portion of the liner 38 and conductive material 40 may be planarized by CMP to the capping material 70. As a result, the lower conductive interconnect lines 14 and 15 are formed embedded in and overlying the lower interlayer dielectric material 34.

Figure 16:
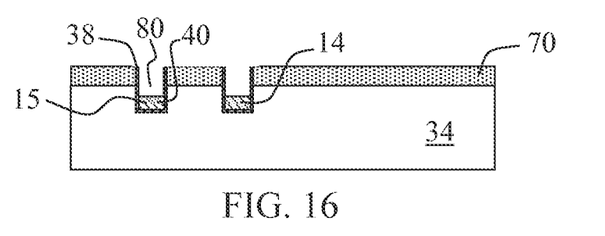

In FIG. 16, the conductive material 40 in the lower conductive interconnect lines 14 and 15 is recessed. For example, a wet etch process selective to removing the conductive material 40 may be performed. An exemplary etch process uses Standard Clean 1 (SC1) followed by hot citric acid, various peroxide based wet cleans followed by citric acid, ATMI SR01. As shown, the liner material 38 and capping material 70 are largely not etched by the conductive material etch process. As a result, recesses 80 are formed over the conductive material 40 and between the sidewall portions of the liner material 38.

Figure 17:
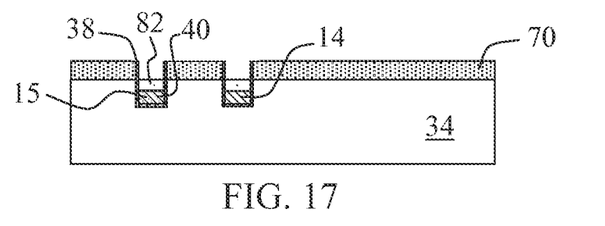

FIG. 17 illustrates the formation of a block material 82 over the conductive material 40. An exemplary block material 82 is an organic polymeric material or a metal that can be removed selective to copper. In an exemplary embodiment, an organic block material 82 is deposited by spin-on followed by etch back to remove excess material. Electroless electroplating may also be used to deposit a metal. As shown, the block material 82 is selectively formed on the conductive material 40. The block material 82 is formed to prevent contact of etchant with the conductive material 40 and encapsulates the conductive material 40.

Figure 18:
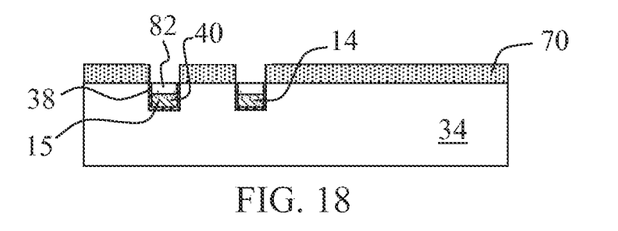

The method may continue with etching the liner material 38 from the capping material 70 in FIG. 18. For example, a wet etchant selective toward etching the liner material 38 may be used. The block material 82 prevents contact of the wet etchant with the conductive material 40. Thus, more aggressive chemicals that are compatible with the dielectics may be used to remove the liner material 38. The liner material 38 is etched to the surface of the block material 82, which, in the illustrated embodiment, is aligned with the surface of the lower interlayer dielectric material 34.

Figure 19:
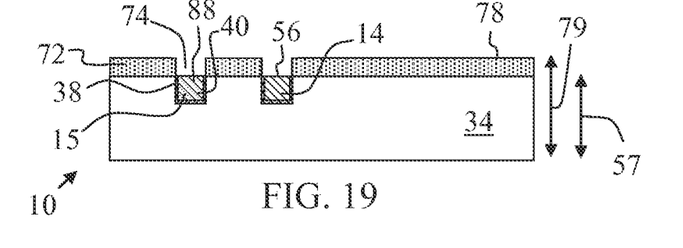

In FIG. 19, the block material 82 is removed. For example, the block material may be removed by a suitable wet chemical etch or a dry etch. If the block material is an organic it may be removed by any suitable solvent, such as acetone, IPA, hexane, etc., or it may be removed by annealing if it decomposes at <300° C., or it may be dry etched in a non-oxidizing plasma such as $NH_3$ or $H_2$. If the block material is a metal such as Co or Mn it may be removed by various wet chemical mixtures that are compatible with copper including dilute acids, such as dilute sulfuric acid, base solutions with pH between 7 and 12, aqueous solution with pH between 4 and 9, or other suitable chemistries. Then additional conductive material 88 is formed over conductive material 40 to reform the lower conductive interconnect lines 14 and 15. For example, a seed material may be deposited on the conductive material 40 and electroless deposition or electroplating may be used to deposit the conductive material 88. In an exemplary embodiment, the conductive material 88 is the same material as conductive material 40, for example, copper. After reformation of the lower conductive interconnect lines 14 and 15 in FIG. 19, the integrated circuit 10 is provided with the same structure as in FIGS. 8 and 11. For example, the insulator cap 72 is formed from the capping material 70 with gaps 74 exposing the upper surfaces 56 of the lower conductive interconnect lines 14 and 15. The insulator cap 72 covers the lower interlayer dielectric material 34. In an exemplary embodiment, the insulator cap 72 is formed with a thickness of from about 3 nm to about 10 nm. The upper surfaces 56 of the lower conductive interconnect lines 14 and 15 are at a height 57 from the semiconductor substrate 12. Further, the insulator cap 72 has an upper surface 78 at a height 79 from the semiconductor substrate 12. As shown, height 79 is greater than height 57. The structure of the integrated circuit 10 in FIG. 19 may be further processed according to FIGS. 20-24.

Figure 20:
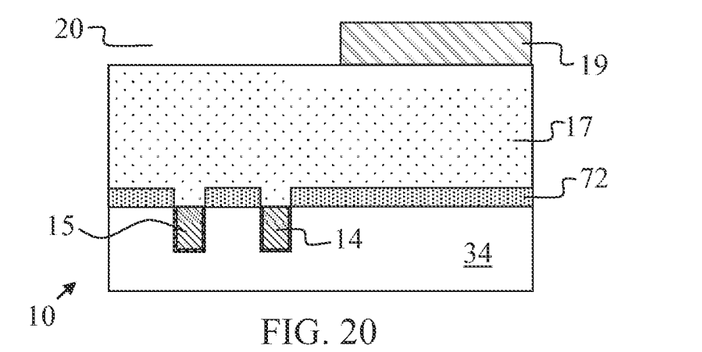

In FIG. 20, the upper interlayer dielectric material 17 is deposited over the semiconductor substrate 12 as indicated above in relation to FIGS. 1-3. Specifically, the upper interlayer dielectric material 17 is deposited over the insulator cap 72 and over the lower conductive interconnect lines 14 and 15. The upper interlayer dielectric material 17 may be the same material as or a different material from the lower interlayer dielectric material 34. For example, the upper interlayer dielectric material 17 may be an ultra low-k (ULK) material such as silicon oxycarbide (SiCOH) or organosilicate glass, and may include two or more layers of such materials. In an exemplary embodiment, the upper interlayer dielectric material 17 is deposited by plasma enhanced chemical vapor deposition (PECVD).

Cross-referencing FIG. 20 with FIG. 2, the mask 19 is deposited and patterned over the upper interlayer dielectric material 17 to form opening 20 exposing the upper interconnect line region 21 of the upper interlayer dielectric material 17. It is noted that the edges 21 of the opening 20 are parallel to the plane of the page, i.e., behind and in front of the plane of the page.

Figure 21:
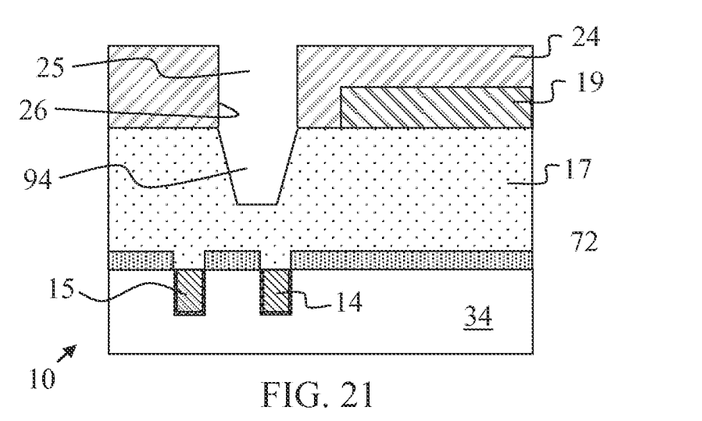

Cross-referencing FIG. 21 with FIG. 3, second mask 24 is formed over mask 19 and the upper interlayer dielectric material 17. As shown, the opening 25 patterned in second mask 24 is bounded by edges 26. The upper interlayer dielectric material 17 underlying both opening 20 and opening 25 is then etched to form an etched via 94.

Figure 22:
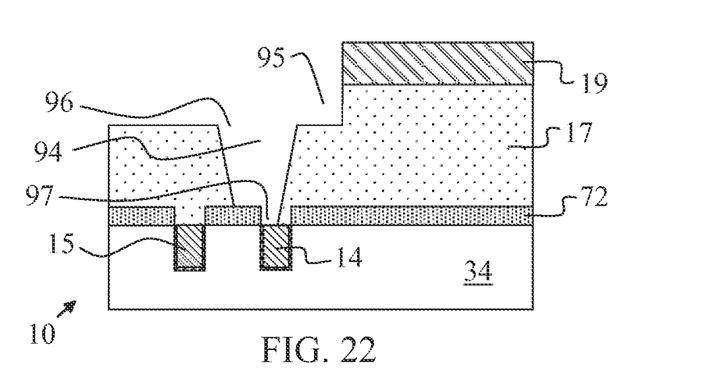

In FIG. 22, second mask 24 is removed. Then another etch process is performed using mask 19 to etch the upper interlayer dielectric material 17. As a result, the etched via 94 lands on the lower conductive interconnect line 14 and region 21 of the upper interlayer dielectric material 17 is removed to form a trench 95 for the upper conductive interconnect line 16. The top end 96 of the etched via 94 is self-aligned with the edges 21 of the opening 20 (shown in FIG. 2). In FIGS. 21-22, an overlay issue with opening 25 in mask 24 causes the etched via 94 to land only partially on the lower conductive interconnect line 14. The portion of the etched via 94 that does not land on the lower conductive interconnect line 14 lands on the insulator cap 72 rather than on the lower interlayer dielectric material 34. Thus, the bottom end 97 of the etched via 94 is self-aligned with the lower conductive interconnect line 14.

Figure 23:
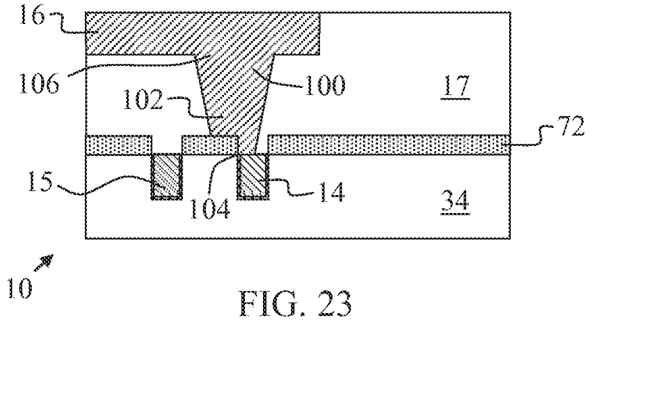

In FIG. 23, a conductive material 100 is deposited over the semiconductor substrate 12 to fill the via 94 to form conductive via 102 and to fill trench 95 to form upper conductive interconnect line 16. As noted above, the conductive via 102 is not fully aligned with the lower conductive interconnect line 14, but the insulator cap 72 aligns the bottom end 104 of the conductive via 102 with the lower conductive interconnect line 14. Further, the insulator cap 72 separates the conductive via 102 from the lower conductive interconnect line 15 to maintain at least the minimum insulator required between the conductive via 102 and the lower conductive interconnect line 15. If the insulator cap 72 were not present, the conductive via 102 would land on the lower interlayer dielectric material 34 and be separated from the lower conductive interconnect line 15 only in the horizontal direction. The insulator cap 72 provides additional separation in the vertical direction. As shown, the conductive via 102 includes a top end 106 aligned with edges 21 of mask 19 illustrated in FIG. 2 and formed integrally with the upper conductive interconnect line 16.

Figure 24:
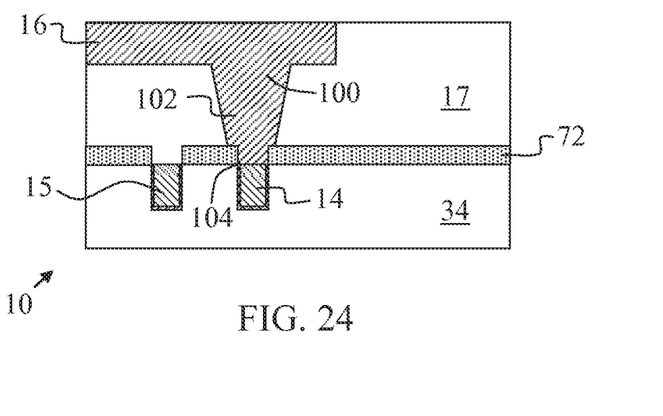

FIG. 24 illustrates a conductive via 102 more fully aligned with the lower conductive interconnect line 14. To form such a conductive via 102, the via etch removes all of the upper interlayer dielectric material 17 from the gap in the insulator cap 72 overlying the lower conductive interconnect line 14. Thus, the bottom end 104 of the conductive via 102 fills the gap in the insulator cap 72 overlying the lower conductive interconnect line 14. Such a conductive via 102 is aligned with both edges of the lower conductive interconnect line 14.

Further processing may be performed to complete fabrication of the integrated circuit, including the formation of additional interlayer dielectric layers, conductive interconnect lines and conductive vias, whether formed in accordance with embodiments disclosed herein or with other processes. The embodiments disclosed herein provide for conductive vias that are aligned with lower conductive interconnect lines in a first orientation and with upper conductive interconnect lines in a second orientation, i.e., dual orientation self-aligned conductive vias. Further, the embodiments provide for reduced TDDB by maintaining sufficient insulator material between interconnect lines and vias despite overlay issues. Additionally, the structures and methods disclosed herein may be easily integrated into integrated circuit fabrication processing.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the structures or methods in any way. Rather, the foregoing detailed description will provide those skilled in the art with a convenient road map for implementing the exemplary embodiment or exemplary embodiments. It should be understood that various changes can be made in the function and arrangement of elements without departing from the scope as set forth in the appended claims and the legal equivalents thereof.

What is claimed is:

1. A method for fabricating an integrated circuit, the method comprising:
    forming a first conductive interconnect line overlying a semiconductor substrate;
    after forming the first conductive interconnect line, forming an insulator cap defining a gap overlying the first conductive interconnect line;
    depositing an upper interlayer dielectric material over the insulator cap and in the gap over the first conductive interconnect line;
    etching a via through the upper interlayer dielectric material and into the gap to expose the first conductive interconnect line; and depositing a conductive material into the via to form a conductive via in contact with the first conductive interconnect line.

2. The method of claim 1 wherein depositing the conductive material into the via to form the conductive via further comprises depositing the conductive material over the upper interlayer dielectric material to form a second conductive interconnect line overlying the upper interlayer dielectric material.

3. The method of claim 1 wherein etching the via through the upper interlayer dielectric material comprises:
patterning a mask over the upper interlayer dielectric material to define a upper conductive interconnect line region; and
etching the via into the upper interlayer dielectric material through the mask to form the via with an upper end aligned with the mask and a lower end aligned with the gap.

4. The method of claim 1 wherein etching the via through the upper interlayer dielectric material comprises performing an etch process selective to etching the upper interlayer dielectric faster than etching the insulator cap.

5. The method of claim 1 further comprising depositing a lower interlayer dielectric material over the semiconductor substrate, wherein forming the insulator cap comprises:
depositing a metal over the lower interlayer dielectric material and the first conductive interconnect line;
annealing the semiconductor substrate to oxidize the metal to form a metal oxide over the lower interlayer dielectric material; and
removing unoxidized metal overlying the first conductive interconnect line.

6. The method of claim 1 wherein:
forming the first conductive interconnect line comprises forming the first conductive interconnect line in a lower interlayer dielectric material overlying the semiconductor substrate, wherein the first conductive interconnect line has an upper surface at a first height over the semiconductor substrate; and
forming the insulator cap comprises forming the insulator cap over the lower interlayer dielectric material, wherein the insulator cap has a top surface at a second height over the semiconductor substrate greater than the first height.

7. The method of claim 1 further comprising depositing a lower interlayer dielectric material over the semiconductor substrate, wherein forming the insulator cap comprises:
selectively depositing a temporary cap over the first conductive interconnect line;
depositing an insulator cap material over the lower interlayer dielectric material and the temporary cap;
removing the insulator cap material overlying the temporary cap; and
selectively removing the temporary cap.

8. The method of claim 7 wherein selectively depositing the temporary cap over the first conductive interconnect line comprises selectively depositing a temporary metal cap over the first conductive interconnect line.

9. A method for fabricating an integrated circuit, the method comprising:
forming a first interconnect line overlying a semiconductor substrate;
forming an insulator cap defining a gap overlying the first interconnect line;
depositing a dielectric over the insulator cap and the first interconnect line;
forming a first mask over the dielectric and having an opening exposing a first region of the dielectric;
forming a second mask over the first mask and the dielectric and exposing a second region of the dielectric within the first region and directly overlying the gap;
etching the second region to form a recess in the first region;
removing the second mask;
etching the first region to convert the recess to a via extending into the gap to expose the first interconnect line and to form a trench located above the via; and
depositing a conductive material into the trench and the via to form a second interconnect line and a conductive via in contact with the first interconnect line.

10. The method of claim 9 wherein:
forming the first interconnect line overlying the semiconductor substrate comprises forming the first interconnect line in a lower interlayer dielectric material overlying the semiconductor substrate, wherein the first interconnect line has an upper surface at a first height over the semiconductor substrate; and
forming the insulator cap comprises forming the insulator cap over the lower interlayer dielectric material, wherein the insulator cap has a top surface at a second height over the semiconductor substrate, and wherein the second height is greater than the first height.

11. The method of claim 9 wherein:
forming the first interconnect line comprises forming the first interconnect line extending in a first direction;
forming the first mask comprises forming the opening extending in a second direction transverse to the first direction;
etching the first region comprises forming the trench extending in the second direction; and
depositing the conductive material into the trench comprises forming the second interconnect line extending in the second direction.

12. The method of claim 9 wherein etching the first region to convert the recess to the via extending into the gap to expose the first interconnect line and to form the trench located above the via comprises performing an etch process selective to etching the dielectric faster than etching the insulator cap.

13. A method for fabricating an integrated circuit, the method comprising:
forming an insulator cap over a semiconductor substrate and defining a gap;
depositing a barrier layer over the semiconductor and in the gap;
depositing a first conductive material over the barrier layer and in the gap;
recessing the first conductive material;
removing an exposed portion of the barrier liner;
depositing a second conductive material over the first conductive material to form a conductive interconnect line;
depositing an upper interlayer dielectric material over the insulator cap and over the conductive interconnect line;
etching a via through the upper interlayer dielectric material to expose the conductive interconnect line; and
depositing a third conductive material into the via to form a conductive via in contact with the conductive interconnect line.

14. The method of claim 13 further comprising:
forming a block material over the first conductive material before removing the exposed portion of the barrier liner; and removing the block material after removing the exposed portion of the barrier liner.

15. The method of claim 13 wherein depositing the third conductive material into the via to form the conductive via further comprises depositing the third conductive material over the upper interlayer dielectric material to form a second conductive interconnect line overlying the upper interlayer dielectric material.

16. The method of claim 13 wherein:
forming the first conductive interconnect line comprises forming the first conductive interconnect line in a lower interlayer dielectric material overlying the semiconductor substrate, wherein the first conductive interconnect line has an upper surface at a first height over the semiconductor substrate; and
forming the insulator cap comprises forming the insulator cap over the lower interlayer dielectric material, wherein the insulator cap has a top surface at a second height over the semiconductor substrate greater than the first height.

* * * * *